(12) United States Patent
McCawley

(10) Patent No.: US 7,732,749 B2
(45) Date of Patent: Jun. 8, 2010

(54) SYSTEM AND METHOD FOR MEASURING THE OUTPUT OF A PHOTODETECTOR AND FOR REDUCING SENSITIVITY TO TEMPERATURE VARIATIONS

(75) Inventor: Michael McCawley, Morgantown, WV (US)

(73) Assignee: Respiratory Management Technology, Morgantown, WV (US)

( * ) Notice: Subject to any disclaimer, the term of this patent is extended or adjusted under 35 U.S.C. 154(b) by 188 days.

(21) Appl. No.: 12/038,910

(22) Filed: Feb. 28, 2008

(65) Prior Publication Data

US 2009/0219091 A1 Sep. 3, 2009

(51) Int. Cl.
*H01J 40/14* (2006.01)
(52) U.S. Cl. .................. 250/214 R; 250/214.1
(58) Field of Classification Search ............ 250/214 R, 250/214.1, 214 AL, 221, 559.4, 222.2; 327/362, 327/546–554, 514; 356/342, 436–438, 221
See application file for complete search history.

(56) References Cited

U.S. PATENT DOCUMENTS 5,808,296 A * 9/1998 McMonagle et al. ........ 250/221
7,256,384 B2 8/2007 Gottesman et al.

* cited by examiner

*Primary Examiner*—Que T Le
(74) *Attorney, Agent, or Firm*—Connolly Bove Lodge & Hutz LLP; Arlene P. Neal

(57) ABSTRACT

A system for measuring the output of a photodetector is disclosed. An integrating amplifier circuit receives a signal output from the photodetector and is adapted to output an integrating amplifier voltage proportional to the signal output from the photodetector. A reference source is adapted to serve as a voltage source and is adapted to output a reference voltage proportional to background light incident upon the photodetector. A difference amplifier electronically coupled to the integrating amplifier circuit and to the adjustable reference, receiving the integrating amplifier voltage and the reference voltage, respectively. The difference amplifier is adapted to generate an amplified output using the reference voltage subtracted from the integrating amplifier voltage.

13 Claims, 2 Drawing Sheets

SYSTEM AND METHOD FOR MEASURING THE OUTPUT OF A PHOTODETECTOR AND FOR REDUCING SENSITIVITY TO TEMPERATURE VARIATIONS

BACKGROUND OF THE INVENTION

1. Field of the Invention

The field of the present invention is signal processing for the output of photodetectors, particularly photodetectors which are used to detect light scattered from a concentration of aerosol particles.

2. Background

Examples of systems that use photodetectors include, but are not limited to, optical character recognition systems, communication systems medical imaging sensors, laser range finders, radiation detectors, smoke detectors, position sensors and proximity sensors. In all of these background art systems, a photodetector is used to measure light or radiation in terms of an electrical signal that is processed in various ways to produce a useful information output. In a particular example from the background art, a beam of collimated light, which may or may not be coherent, is directed through a transparent cell in which particles suspended in fluid mixtures are made to pass. Photodetectors are then used to detect the relative amount of light that is scattered or blocked by the particles. The signals generated by the photodetector contain information about the concentration of particles, size of particles, and/or presence of particles.

The type of photodetector used depends on the sensitivity requirements of the device. A photo-multiplier tube is the most sensitive (and costly) method that is currently available. A photo-multiplier can detect the presence of a single photon with nanosecond resolution. However, photo-multiplier tubes are very costly to manufacture and are easily damaged. Additionally they have very high voltage requirements and therefore tend to be used in laboratories rather than in commercial applications.

One alternative to using a photo-multiplier tube is to use a photodiode and a transimpedance amplifier. In contrast to a photo-multiplier, photodiodes are inexpensive, rugged, small, and operate at low voltages.

Another background art device that is used to measure aerosol particle size and concentration is called a light scattering photometer or nephelometer. Applications that require particularly sensitive measurements require photo-multiplier-based photometers.

When the sensitivity requirements of the application do not justify the use of a photo-multiplier tube, a photodiode-based device is preferred due to the reduced cost. However, photodiodes are generally not as sensitive as photo-multiplier tubes and are prone to noise problems associated with electrical amplification.

Attempts have been made to enhance the signal output from photodetectors. One such attempt is described in U.S. Pat. No. 7,256,384, the disclosure of which is incorporated herein by reference. However, while this approach manages to enhance the signal output from a photodetector, it still suffers from the same shortcoming as other methods known in the prior art—each measurement output from the photodetector represents an instantaneous measurement of a discrete moment in time. Thus, signal enhancement techniques currently practiced generally average a number of samples taken over a period of time. In this way, current techniques sample the rapidly changing signal output from the photodetector and use the average of multiple samples as a representative output of the photodetector.

SUMMARY OF THE INVENTION

The present invention is directed toward a system and method for measuring the output of a photodetector. In the system, an integrating amplifier circuit receives a signal output from the photodetector and is adapted to output an integrating amplifier voltage proportional to the signal output from the photodetector. A reference source is adapted to serve as a voltage source and is adapted to output a reference voltage proportional to background light incident upon the photodetector. A difference amplifier electronically coupled to the integrating amplifier circuit and to the adjustable reference, receiving the integrating amplifier voltage and the reference voltage, respectively. The difference amplifier is adapted generate an amplified output using the reference voltage subtracted from the integrating amplifier voltage.

The system may be constructed with additional options to improve functionality. Any of these options may be implemented separately or in combination. As one option, the integrating amplifier circuit includes a capacitor which receives the signal output from the photodetector. Current from the output signal builds a charge on the capacitor, thus creating a voltage across the capacitor that is proportional to the output signal.

As another option, the integrating amplifier circuit may be designed to receive and read output signals from the photodetector on the order of 10 pA to 100 pA, or even 100 pA to 1000 pA.

As another option, the system further includes a reset frequency generator adapted to output a reset frequency signal. The integrating amplifier circuit is adapted to receive the reset frequency signal, and in response to the reset frequency signal, the integrating amplifier circuit periodically resets the integrating amplifier voltage output. Alternatively, the reset frequency generator may be integrated into the integrating amplifier circuit.

As yet another option, an LED is driven by a constant current source and draws voltage which is used to adjust the amplified output from the difference amplifier.

In the method, a signal output from the photodetector is accumulated in an integrator. An output voltage from the accumulated signal is then generated such that the output voltage is proportional to the signal output from the photodetector. A reference voltage is also generated, the reference voltage being proportional to background light incident upon the photodetector. Next, an amplified output is generated using the reference voltage subtracted from the integrating amplifier voltage. Any of the above options described for the system may be incorporated into the method.

Accordingly, an improved system and method for measuring the output of a photodetector are disclosed. Advantages of the improvements will appear from the drawings and the description of the preferred embodiment.

BRIEF DESCRIPTION OF THE DRAWINGS

In the drawings, wherein like reference numerals refer to similar components.

DETAILED DESCRIPTION OF THE PREFERRED EMBODIMENTS

Figure 1:
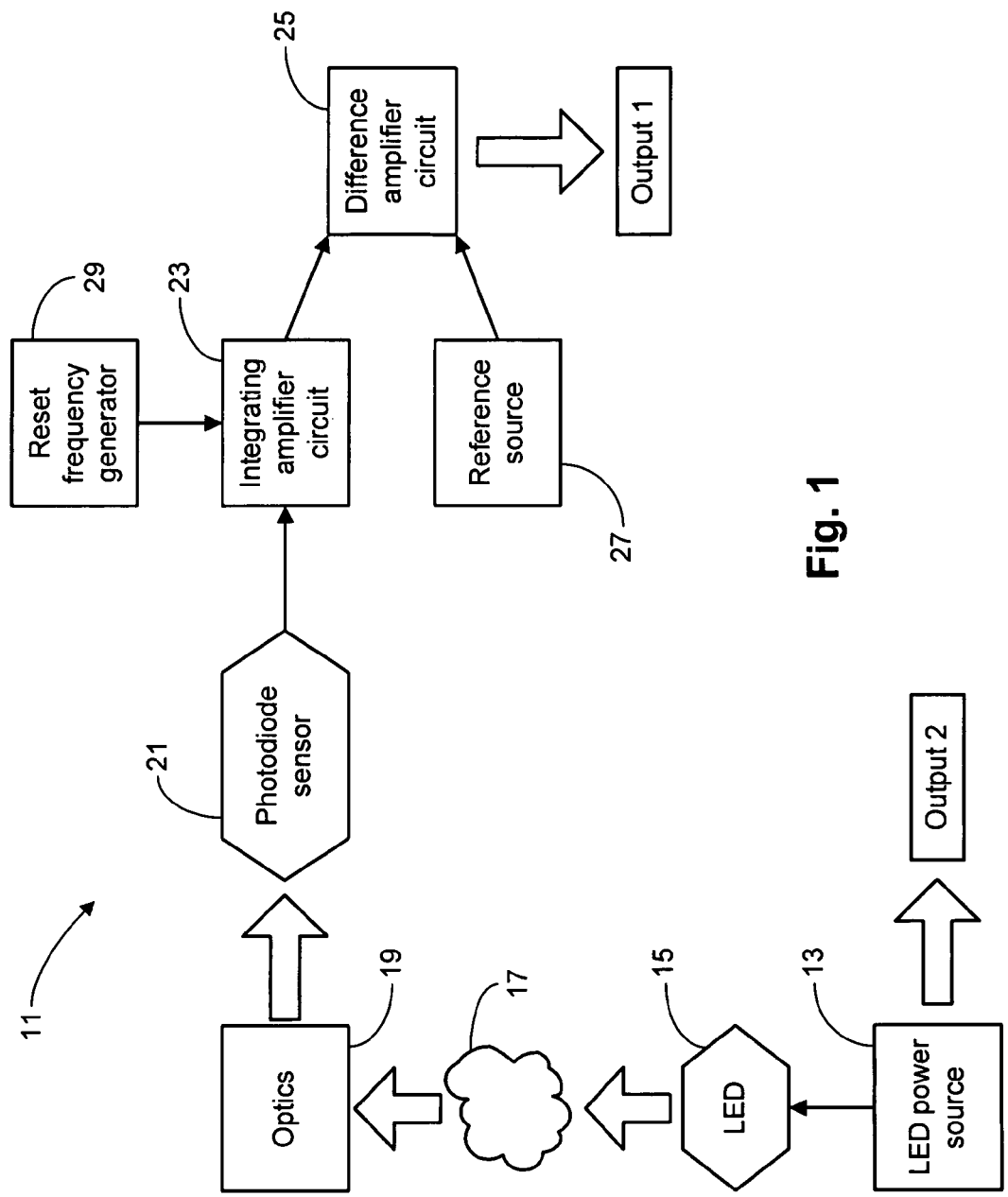
FIG. 1 illustrates a system for measuring the output of a photodetector.

Turning in detail to the drawings, FIG. 1 illustrates a photometer system 11 which is particularly advantageous for measuring aerosol concentrations, although those skilled in the art will recognize that the system may be easily adapted for other uses of photodetector. The system 11 includes a constant current power source 13 that drives the LED 15. The power source 13 outputs, as Output 2, the voltage draw of the LED 15. This output is used further in the process to aid in rendering the concentration measurement independent of temperature, thereby allowing a more accurate determination of airborne particle concentration. By driving the LED 15 with the constant current source 13, fluctuations in the LED's brightness can be measured as changes in the voltage draw of the LED 15. Since the changes in voltage draw of the LED 15 affect the brightness output in a known manner, the brightness of the LED 15 at any given time during a measurement can be determined. Further, with these changes the output of the photometer 11 can be corrected for temperature variations, thus rendering the final output of the photometer 11 substantially, and maybe completely, independent of temperature. The LED 15 preferably provides a constant light source at a fixed wavelength. Some LEDs may require an initial start up period to reach a constant state and provide such steady-state output. Other types of light sources may also be used.

The LED 15 illuminates the test area 17. As indicated, for purposes of this embodiment the test area comprises aerosolized particles, although it could be comprised of any other matter, material, structure, and the like which is susceptible to analysis using a photodetector. Optics 19 collect light passing through the test area 17 and direct that light toward the photodiode sensor 21. The configuration of the optics 19 are independent of the electrical design, as the design of the optics will generally depend upon the type of matter, material, structure, etc. being analyzed.

The photodetector, a photodiode sensor 21, is preferably a silicon photodiode, although any application appropriate photodetector may be used. For aerosol concentration measuring systems, such photodiodes have been found to have the greatest sensitivity in the spectral output range of the preferred LED. Such photodiodes are also advantageous because they have low temperature dependence in the range of operation for which aerosol photometers are frequently operated.

After receiving light from the optics 19, the photodiode sensor 21 generates an output signal that is sent to the integrating amplifier circuit 23. Such integrating amplifier circuits are well known to those skilled in the electronic arts. The integrating amplifier circuit 23 accumulates charge, generally in a capacitor, from the output signal of the photodiode sensor 21. The accumulated charge creates a voltage potential across the capacitor, and this voltage potential is measured at discrete intervals and output to the difference amplifier circuit 25. By measuring the output signal from the photodiode sensor 21 in this manner, the integrating amplifier serves to compensate for temperature variability inherent in the photodiode sensor 21, thereby rendering the integrating amplifier signal linearly proportional to the output signal of the photodiode sensor 21. The integrating amplifier circuit 23 may be constructed to read the output signal from the photodiode sensor 21 in a variety of ranges, from 10 pA to 100 pA, or from 100 pA to 1000 pA, or any other range desirable depending upon the particular components used to construct the integrating amplifier circuit and the frequency at which the voltage potential is measured.

The frequency at which measurement samples are generated by the integrating amplifier circuit 23 is governed by the reset frequency generator 29. The reset frequency generator 29 generates a reset frequency signal which periodically triggers a reset of the integrating amplifier circuit 23. When a capacitor is used as the accumulator, this reset includes discharging the accumulated charge on the capacitor to begin a new measurement cycle. The timing of the reset may be adjusted to accommodate a wide variety of circumstances. For example, if the output signal from the photodetector is high, because of a high aerosol concentration or otherwise, then the reset period can be decreased to account for the increased charge. Alternatively, if the output signal from the photodetector is low, because of a low aerosol concentration or otherwise, then the reset period can be lengthened to permit more charge to accumulate in the integrating amplifier circuit 23.

The reference source 27 is a voltage source which provides a reference signal input to the difference amplifier circuit 25. This reference signal generated is proportional to the measured amount of background light. Circuits and systems for measuring background light are known to those skilled in the art, and as such are not detailed herein. The difference amplifier circuit 25 subtracts the reference signal from the integrating amplifier signal and generates an amplified output signal, Output 1, which may be used by additional systems to process and analyze the signal. The additional systems include a timing circuit that is synchronized with the output of the reset frequency generator so that data is accurately collected. Such systems, such as analogue to digital converters, digital processing equipment, and the like, are well known to those of skill in the art.

Figure 2:
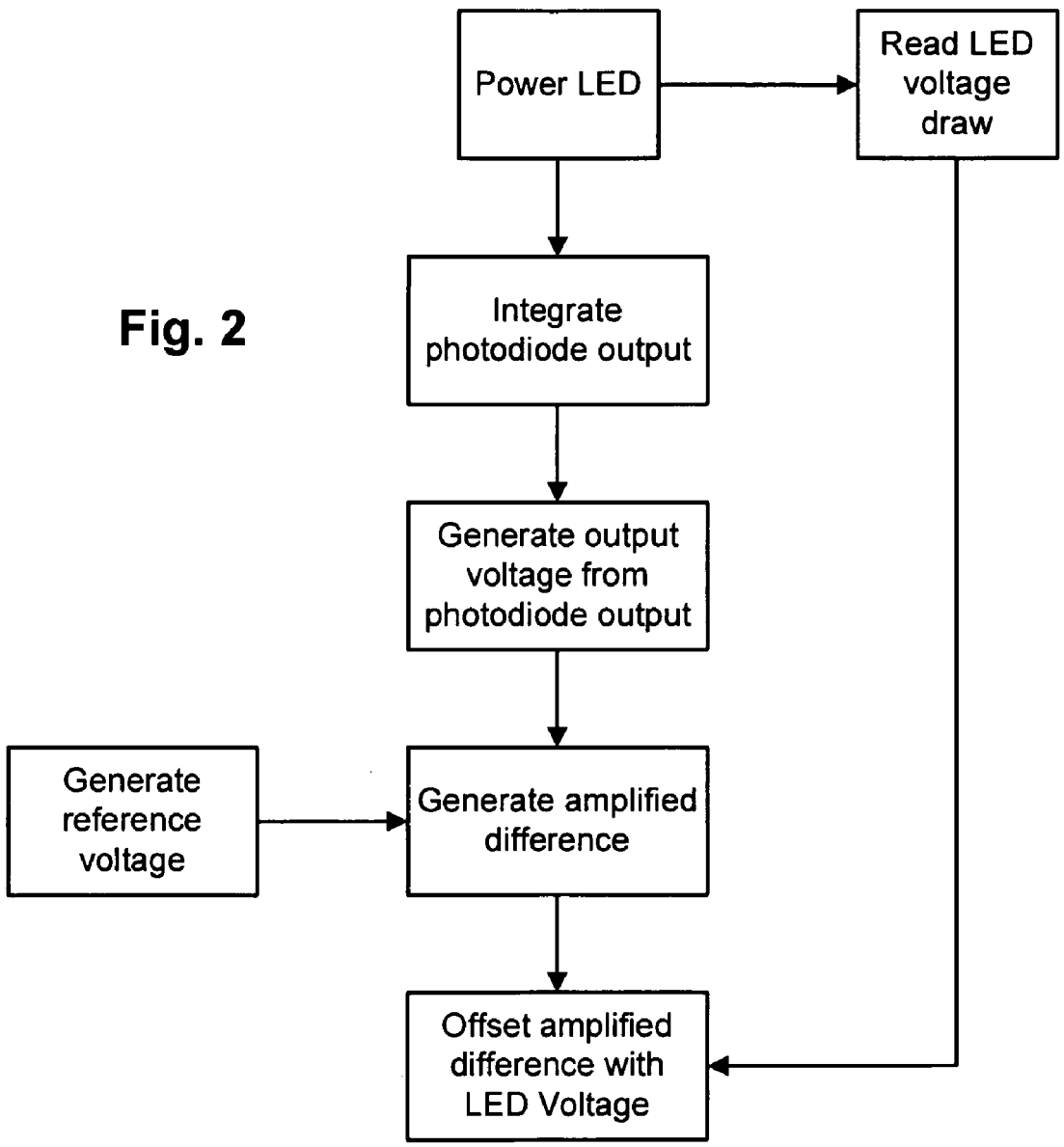
FIG. 2 is a flowchart showing the process for measuring the output of a photodetector.

With the two outputs from the photometer system 11, Output 1 and Output 2, the other systems may use the voltage measurement of Output 2 to offset the measurement of Output 1 and render the final measurement at least substantially independent, if not completely independent, of ambient temperature variations that might occur during the course of obtaining the measurements of Output 1. The entire process, from independent of the equipment used with the photodetector, is shown in the flowchart of FIG. 2.

The system described above uses an analogue integrator, as opposed to digitizing the output of a photometer and averaging the digitized signals, as has been practiced in the prior art, to measure the output of a photodetector over a period of time. This technique allows measurement of a rapidly changing signal and enables all peaks and valleys within any series of concentration measurements to be included in the measurement. In addition, this technique permits the measurement of extremely small aerosol concentrations taken over an appropriate period of time. In its simplest form, the system described herein provides an improved signal response and reduced sensitivity to temperature variations. Once the voltage draw of the LED is accounted for in the output signal, then the measurements of the photometer system are rendered nearly independent of ambient temperature variations.

Thus, a system and method for measuring the output of a photodetector are disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. A system for measuring the output of a photodetector, the system comprising:

an integrating amplifier circuit receiving a signal output from the photodetector, wherein the integrating amplifier circuit is adapted to output an integrating amplifier voltage proportional to the signal output from the photodetector;

a reference source adapted to serve as a voltage source and to output a reference voltage proportional to background light incident upon the photodetector; and a difference amplifier electronically coupled to the integrating amplifier circuit and to the reference source, receiving the integrating amplifier voltage and the reference voltage, respectively, the difference amplifier being adapted to generate an amplified output using the reference voltage subtracted from the integrating amplifier voltage.

2. The system of claim 1, wherein the integrating amplifier circuit includes a capacitor which receives the signal output from the photodetector, such that a build up of charge on the capacitor from the output signal creates a voltage across the capacitor which is proportional to the output signal.

3. The system of claim 1, wherein the integrating amplifier circuit is adapted to receive and read output signals from the photodetector on the order of 10 pA to 100 pA.

4. The system of claim 1, wherein the integrating amplifier circuit is adapted to receive and read output signals from the photodetector on the order of 100 pA to 1000 pA.

5. The system of claim 1, further comprising a reset frequency generator adapted to output a reset frequency signal to the integrating amplifier circuit, wherein in response to the reset frequency signal, the integrating amplifier circuit periodically resets the integrating amplifier voltage output.

6. The system of claim 1, further comprising an LED power source configured as a constant current source for an LED, wherein an LED voltage draw is output from the LED power source.

7. A method of measuring the output of a photodetector, the method comprising:
   accumulating a signal output from the photodetector in an integrator;
   generating an output voltage from the accumulated signal, the output voltage being proportional to the signal output from the photodetector;
   generating a reference voltage proportional to a background light incident upon the photodetector; and
   generating an amplified output using the reference voltage subtracted from the integrating amplifier voltage.

8. The method of claim 7, wherein the signal output is on the order of 10 pA to 100 pA.

9. The method of claim 7, wherein the signal output is on the order of 100 pA to 1000 pA.

10. The method of claim 7, wherein accumulating the signal output includes building up charge on a capacitor within an integrating amplifier circuit.

11. The method of claim 8, wherein generating the output voltage includes generating the output voltage from a capacitor voltage resulting from the built up charge on the capacitor from the signal output.

12. The method of claim 7, further comprising periodically resetting the output voltage using a reset frequency signal directed into the integrator.

13. The method of claim 7, further comprising:
   driving an LED with a constant current source;
   outputting a voltage draw of the LED from the constant current source; and
   offsetting the amplified output using the voltage draw.

* * * * *